(12) United States Patent
Zhou

(10) Patent No.: US 9,622,343 B2
(45) Date of Patent: Apr. 11, 2017

(54) FLEXIBLE DISPLAY AND METHOD FOR PREPARING THE SAME

(71) Applicant: BOE TECHNOLOGY GROUP CO., LTD., Beijing (CN)

(72) Inventor: Weifeng Zhou, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 365 days.

(21) Appl. No.: 14/353,843

(22) PCT Filed: Sep. 24, 2013

(86) PCT No.: PCT/CN2013/084047
§ 371 (c)(1),
(2) Date: Apr. 24, 2014

(87) PCT Pub. No.: WO2015/000225
PCT Pub. Date: Jan. 8, 2015

(65) Prior Publication Data
US 2016/0021732 A1    Jan. 21, 2016

(30) Foreign Application Priority Data
Jul. 3, 2013    (CN) .......................... 2013 1 0276959

(51) Int. Cl.
*B29C 65/52* (2006.01)
*B32B 37/12* (2006.01)
(Continued)

(52) U.S. Cl.
CPC ............... *H05K 1/028* (2013.01); *B32B 7/06* (2013.01); *B32B 7/12* (2013.01); *B32B 9/045* (2013.01);
(Continued)

(58) Field of Classification Search
USPC ........ 156/247, 701, 714, 717; 428/412, 419, 428/428, 442, 448, 473.5, 480, 482, 522;
(Continued)

(56) References Cited

U.S. PATENT DOCUMENTS 8,436,354 B2    5/2013  Aoki et al.
8,722,185 B2 *  5/2014  Niwa .................. C09J 133/26
                                                    428/355 AC
(Continued)

FOREIGN PATENT DOCUMENTS

CN        1527952 A    9/2004
CN      101009207 A    8/2007
(Continued)

OTHER PUBLICATIONS

PCT/CN2013/084047 Search Report and Written Opinion; dated Apr. 10, 2014; 8 pages.
(Continued)

*Primary Examiner* — Sing P Chan
(74) *Attorney, Agent, or Firm* — Brooks Kushman P.C.

(57) ABSTRACT

The present invention provides a flexible display and a method for preparing the same. The method comprises the steps of: providing a first substrate; forming a bonding agent layer on a first surface of the first substrate; providing a second substrate; attaching the surface of the first substrate, on which the bonding agent layer is formed, to the second substrate, wherein the adhesive force between the bonding agent layer and the second substrate is lower than 5 N/20 mm-wide bonding agent layer; forming a display device body on a second surface of the first substrate; and peeling off the first substrate, on which the display device body is formed, from the second substrate, and obtaining the flexible display.

13 Claims, 4 Drawing Sheets

(51) Int. Cl.

| | |
|---|---|
| *B32B 37/26* | (2006.01) |
| *B32B 38/04* | (2006.01) |
| *B32B 38/10* | (2006.01) |
| *H05K 1/02* | (2006.01) |
| *G02F 1/1333* | (2006.01) |
| *B32B 7/12* | (2006.01) |
| *B32B 15/08* | (2006.01) |
| *B32B 27/06* | (2006.01) |
| *B32B 27/28* | (2006.01) |
| *B32B 27/36* | (2006.01) |
| *H05K 1/18* | (2006.01) |
| *H05K 3/20* | (2006.01) |
| *H05K 3/30* | (2006.01) |
| *B32B 9/04* | (2006.01) |
| *B32B 27/20* | (2006.01) |
| *B32B 7/06* | (2006.01) |
| *H01L 51/00* | (2006.01) |

(52) U.S. Cl.
CPC .............. *B32B 15/08* (2013.01); *B32B 27/06* (2013.01); *B32B 27/20* (2013.01); *B32B 27/281* (2013.01); *B32B 27/286* (2013.01); *B32B 27/36* (2013.01); *B32B 27/365* (2013.01); *B32B 37/12* (2013.01); *B32B 38/10* (2013.01); *G02F 1/1333* (2013.01); *G02F 1/133305* (2013.01); *H05K 1/181* (2013.01); *H05K 3/20* (2013.01); *H05K 3/30* (2013.01); *B32B 37/1284* (2013.01); *B32B 38/04* (2013.01); *B32B 2307/7244* (2013.01); *B32B 2307/7246* (2013.01); *B32B 2307/7265* (2013.01); *B32B 2315/08* (2013.01); *B32B 2457/20* (2013.01); *G02F 2202/28* (2013.01); *H01L 51/003* (2013.01); *H01L 51/0097* (2013.01); *H05K 2201/051* (2013.01); *H05K 2201/10128* (2013.01)

(58) Field of Classification Search
USPC .............................................. 361/749; 29/846
See application file for complete search history.

(56) References Cited

U.S. PATENT DOCUMENTS

| | | | |
|---|---|---|---|
| 9,013,650 | B2 | 4/2015 | Yamazaki et al. |
| 9,123,595 | B2 * | 9/2015 | Yamazaki ......... G02F 1/133305 |
| 2002/0182766 | A1 * | 12/2002 | Yamamoto ........ G02F 1/133351 |
| | | | 438/30 |
| 2004/0169809 | A1 * | 9/2004 | Yamabuchi ....... G02F 1/133351 |
| | | | 349/153 |
| 2005/0197450 | A1 | 9/2005 | Amano et al. |
| 2009/0266471 | A1 | 10/2009 | Kim et al. |
| 2010/0143664 | A1 * | 6/2010 | Lyublinski ............. B32B 27/32 |
| | | | 428/195.1 |

FOREIGN PATENT DOCUMENTS

| | | |
|---|---|---|
| CN | 101183201 A | 5/2008 |
| CN | 101305315 A | 11/2008 |
| CN | 102290422 A | 12/2011 |
| CN | 102317399 A | 1/2012 |
| CN | 203311126 U | 11/2013 |
| EP | 1089113 A2 | 4/2001 |
| JP | 2008072087 A | 3/2008 |
| WO | 02/099479 A2 | 12/2002 |

OTHER PUBLICATIONS

Chinese Office Action of corresponding CN 201310276959.3; dated Apr. 3, 2015; 8 pages.
Chinese Office Action of corresponding CN 201310276959.3; dated Apr. 3, 2015; 5 pages [English Translation].
PCT Search Report and Written Opinion dated Apr. 10, 2014, Application No. PCT/CN2013/084047, 14 pages.

* cited by examiner

FLEXIBLE DISPLAY AND METHOD FOR PREPARING THE SAME

CROSS-REFERENCE TO RELATED APPLICATION

This application is the U.S. national phase of PCT Application No. PCT/CN2013/084047 filed on Sep. 24, 2013, which claims priority to Chinese Patent Application No. 201310276959.3 filed on Jul. 3, 2013, the disclosures of which are incorporated in their entirety by reference herein.

FIELD OF THE INVENTION

The present invention relates to the field of displays, and in particular, to a flexible display and a method for preparing the same.

DESCRIPTION OF THE PRIOR ART

Liquid crystal display (LCD) technologies have been developed rapidly in recent decade, and great improvements have been gained in terms of from screen size to display quality. With continuous efforts, the various performances of LCD have reached the level of traditional cathode ray tube (CRT) displays, and it has a tendency to replace the CRT displays.

As the production of LCD increases continuously, the competition among the manufacturers also increases with each passing day. While making continuous efforts to lower the production cost of the products, each manufacturer also tries to improve the product performances and add more functions, so as to increase the added value of the product and raise its market competitive power.

With the development of flexible display technologies, the flexible display products which are more and more approaching to the traditional display modes will soon go into the life of ordinary people. Because of the intrinsic flexibility of a flexible display, it will bring about a lot of specific user experiences.

At present, there mainly exist two methods for attaching a plastic substrate onto a glass base substrate. In the first method, a plastic substrate and a glass substrate are firmly bonded together by employing a bonding agent with a viscosity as high as possible, and after a display device is prepared, the bonding agent between the plastic substrate and the glass substrate is irradiated in a scan mode by laser from the back of the glass substrate to age and stiffen the bonding agent so that the plastic substrate can be easily peeled off from the surface of the glass substrate. In the second method, a layer of poly(p-xylene) is deposited on a glass substrate via evaporation so as to form a debonding layer, and then a polyamic acid solution is coated on the glass substrate and cured to form polyimide so that the plastic substrate is easily peeled off from the glass substrate by use of the debonding layer.

Both of the above methods have unavoidable disadvantages. For the first method, since a laser process is employed, the production efficiency will be low and the cost will be high. For the second method, since poly(p-xylene) is employed to form a debonding layer and an evaporation is required to prepare the layer poly(p-xylene) on a glass substrate, which is a process of very high cost, the production cost will be very high.

SUMMARY OF THE INVENTION

In order to solve the problem that during the manufacturing of the existing flexible display, a complex process is required to peel off a plastic substrate from a glass substrate and thus the production cost is very high, the present invention provides a flexible display and a method for preparing the same.

The technical solutions employed by the present invention are as follows.

The present invention provides a method for preparing a flexible display, comprising the steps of:

providing a first substrate;

forming a bonding agent layer on a first surface of the first substrate;

providing a second substrate;

attaching the surface of the first substrate, on which the bonding agent layer is formed, to the second substrate, wherein the adhesive force between the bonding agent layer and the second substrate is lower than 5 N/20 mm-wide bonding agent layer;

forming a display device body on a second surface of the first substrate which is opposite to the first surface of the first substrate; and peeling off the first substrate, on which the display device body is formed, from the second substrate, and obtaining the flexible display.

The invention further provides a flexible display, comprising: a display device body; a first substrate; a bonding agent layer; and a planarization layer and/or a water/oxygen barrier layer arranged between the first substrate and the display device body, wherein a first surface of the first substrate is connected with the bonding agent layer, and a second surface of the first substrate that is opposite to the first surface is connected with the planarization layer and/or the water/oxygen barrier layer; and the adhesive force between the bonding agent layer and the second substrate for bearing the bonding agent layer is lower than 5 N/20 mm-wide bonding agent layer.

The invention has the following beneficial effects: in the preparation method of the flexible display according to the invention, a bonding agent layer with a low adhesive force is formed on a first substrate, and since the adhesive force of the bonding agent is low, it is very easy to peel off the first substrate, on which the display device body is formed, from the second substrate. In comparison with the existing preparation method of the flexible display device, in the preparation method of the present invention, no laser backside processing is required, no costly debonding layer for lowering the adhesive force between the first substrate and the second substrate needs to be prepared, and no undesirable phenomenon such as substrate wrinkling, etc., occurs during the process, so that the production cost is lowered, and the production efficiency is high, thus the preparation method of the present invention is applicable for large-scale production.

DETAILED DESCRIPTION OF THE PREFERRED EMBODIMENTS

In order to make the technical problems to be solved, the technical solutions and the advantages of the present invention more apparent, the present invention will be described in detail below in conjunction with the drawings and specific embodiments.

Figure 1:
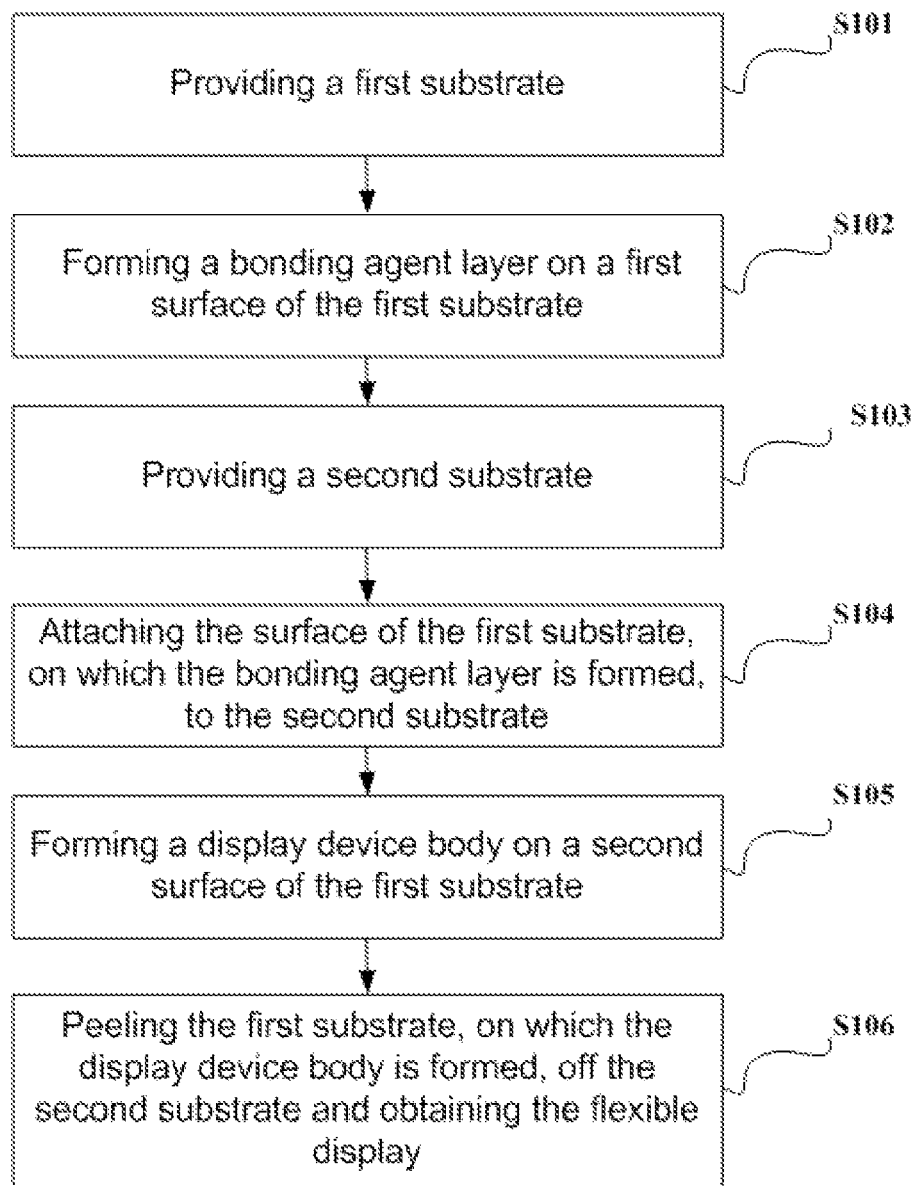
FIG. 1 is a flow chart of a method for preparing a flexible display according to one embodiment of the invention.

As shown in FIG. 1, it is a flow chart of a method for preparing a flexible display according to one embodiment of the invention, which comprises the steps of:

Step S101: providing a first substrate;

Step S102: forming a bonding agent layer on a first surface of the first substrate;

Step S103: providing a second substrate;

Step S104: attaching the surface of the first substrate on which the bonding agent layer is formed to the second substrate, wherein the adhesive force between the bonding agent layer and the second substrate is lower than 5 N/20 mm-wide bonding agent layer;

Step S105: forming a display device body on a second surface of the first substrate, which is opposite to the first surface of the first substrate; and Step S106: peeling off the first substrate, on which the display device body is formed, from the second substrate, and obtaining the flexible display.

In the preparation method of the flexible display of the invention, a bonding agent layer with a low adhesive force is formed on a first substrate, and since the adhesive force of the bonding agent is low, it is very easy to peel off the first substrate, on which the display device body is formed, from the second substrate. In comparison with the existing preparation method of the flexible display device, in the invention, no laser backside processing is required, no costly debonding layer for lowering the adhesive force between the first substrate and the second substrate needs to be prepared, and no undesirable phenomenon such as substrate wrinkling, etc., occurs during the process, so that the production cost is lowered, and the production efficiency is high, thus the preparation method of the present invention is applicable for large-scale production.

The bonding agent layer of the invention can lower the adhesive force with the second substrate, for example, a bonding agent may be formed by adding a filler to silica gel, so that the adhesive force between the silica gel and the first substrate is lowered by a material with no or poor adhesive capacity. A flexible display made of silica gel can endure a high temperature of 300-500° C.; and correspondingly the filler in the silica gel also employs a material that can endure high temperature, such as a material that can endure a high temperature of 300-500° C. The bonding agent of the invention may also be formed by adding a filler to acrylic resin so that it may be applied to a touch screen that can endure a temperature of 230° C., and correspondingly the filler thereof may also employ a material that can endure a temperature of 230° C.

The adhesive force between the bonding agent layer of the invention and the second substrate for bearing the bonding agent layer is lower than 5 N/20 mm-wide bonding agent layer, preferably, it is lower than 1 N/20 mm-wide bonding agent layer, and more preferably, it is 0.03 N-0.1 N/20 mm-wide bonding agent layer. (In the field of the present invention, the comparison between adhesive forces is based on the adhesive force generated by a 20 mm-wide object, and since the adhesive force is generated by a bonding agent layer, the adhesive force is based on a 20 mm-wide bonding agent layer. That is, the adhesive force is the force required to pull a 20 mm-wide object off a target object from an end portion in an orientation parallel to the object after adhering the 20 mm-wide object to the target object via a bonding agent.). When the adhesive force of the bonding agent layer of the invention falls within the above range, the desirable attachment between the first substrate and the second substrate may be realized, and the first substrate can be easily peeled off from the second substrate.

The second substrate in the invention is used for bearing the bonding agent layer and the first substrate, and it may be one or more selected from a group consisting of a glass substrate, a metal substrate, a quartz substrate or an organic substrate. In this embodiment, a glass substrate is selected as the second substrate. Preferably, the first substrate of the invention is a plastic substrate with a thermal expansion coefficient between 1-50 ppm/C; and more preferably, it is a plastic substrate with a thermal expansion coefficient between 3-20 ppm/° C. In the invention, a plastic substrate with a thermal expansion coefficient within the above range is employed to keep a thermal expansion coefficient similar to that of a glass substrate, so that a thermal shock may be lowered, and wrinkling of plastic films may be avoided during a vacuum high-temperature process. The material of the plastic substrate may be polyimide (PI), polyethylene naphthalate (PEN), polyethylene terephthalate (PET), fiber-reinforced plastic (FRP), polyethersulfone resin (PES), polyarylester (PAR) or polycarbonate (PC), etc.

Figure 2:
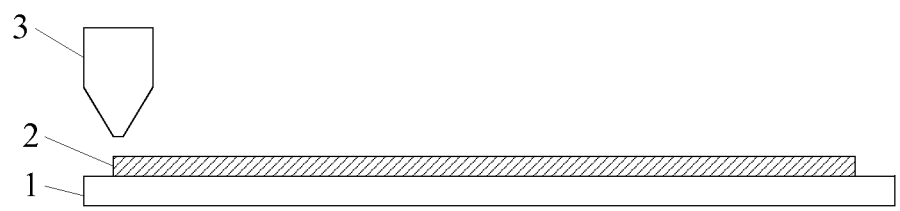
FIG. 2 is a schematic diagram showing the preparation method of a bonding agent layer according to one embodiment of the invention.

As shown in FIG. 2, it is a schematic diagram showing the preparation method of a bonding agent layer according to one embodiment of the invention, wherein a bonding agent is coated via a jet nozzle 3 on the first surface of a first substrate 1 that employs polyimide as the material, thus a bonding agent layer 2 is prepared. The bonding agent may be formed by adding an organic or inorganic filler to silica gel or acrylic resin, for example, by adding a polyterephthalate-type plastic (PET), polyurethane, silicon oxide and titanium oxide, etc., so that the adhesive force of the bonding agent layer formed will be low. Since the adhesive force of the bonding agent layer is low, the first substrate on which the display device body is formed may be very easily peeled off from the second substrate without employing a debonding layer or laser processing, so that the production cost may be lowered, and the operation will be convenient.

Figure 3:
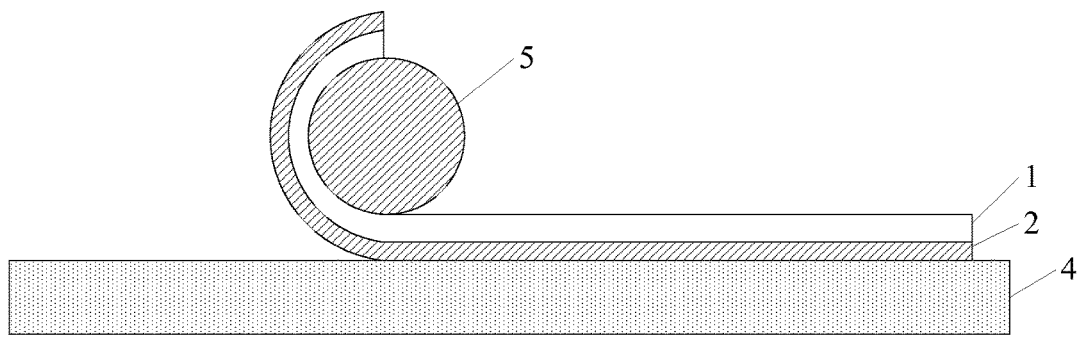
FIG. 3 is a schematic diagram showing the bonding of a bonding agent layer and a second substrate according to one embodiment of the invention.

As shown in FIG. 3, it is a schematic diagram showing the bonding of a bonding agent layer and a second substrate according to one embodiment of the invention. The surface of the first substrate on which the bonding agent layer is formed is attached to the second substrate 4, and the first substrate 1 is attached via an attachment roller 5 to the second substrate 4 made of glass, so that the bonding agent layer 2 and the second substrate 4 are bonded together. However, the bonding between the bonding agent layer 2 and the second substrate is not limited to the employment of an attachment roller, and other modes may also be employed to attach the bonding agent layer to the second substrate, for example, hand pressing, etc.

Figure 4:
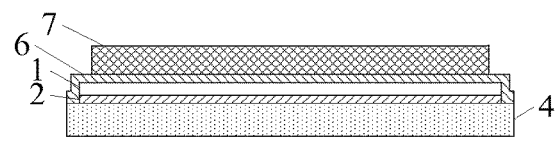
FIG. 4 is a schematic diagram showing the preparation method of a display device body according to one embodiment of the invention.

As shown in FIG. 4, it is a schematic diagram showing the preparation method of a display device body according to one embodiment of the invention. After the bonding between the bonding agent and the second substrate is accomplished, a planarization layer and/or a water/oxygen barrier layer is formed on a second surface of the first substrate, and then a display device body 7 is formed on the planarization layer and/or the water/oxygen barrier layer. In FIG. 4, label 6 represents a planarization layer and/or a water/oxygen barrier layer, and a water/oxygen barrier layer or a planarization layer, or both, may exist between the bonding agent and the display device body 7, which may be configured according to practical production.

Figure 5:
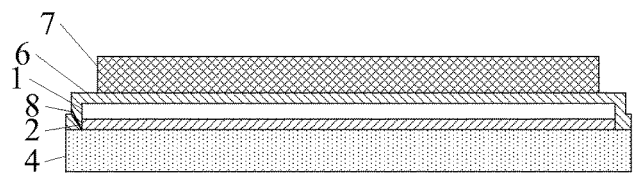
FIG. 5 is a schematic diagram showing the first state in which a display device body is cut according to one embodiment of the invention.
Figure 6:
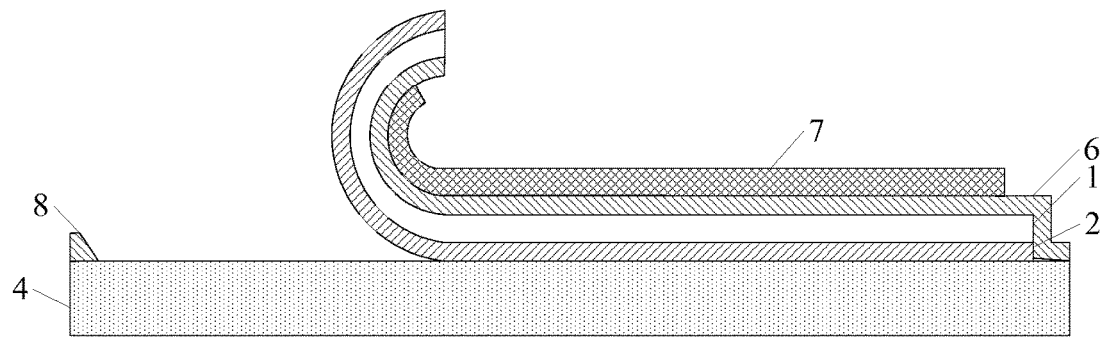
FIG. 6 is a schematic diagram showing the second state in which the display device body is cut according to one embodiment of the invention.

As shown in FIGS. 5 and 6, they are schematic diagrams showing the cutting of a display device according to one embodiment of the invention. In order to peeling off the first substrate, on which a display device body is formed, from the second substrate, the planarization layer and/or the water/oxygen barrier layer on the edge of the first substrate is cut so as to for a slot 8, which may form a certain tilt angle with the surface of the first substrate, for example, 30-60 degrees; and then the first substrate on which the display device body is formed is peeled off from the second substrate along the slot 8 using a mechanical force, thus the flexible display is obtained. Finally, the first substrate 1, together with the display device body 7 on it, is peeled off using a mechanical force, and the preparation of a flexible display is accomplished.

Figure 7:
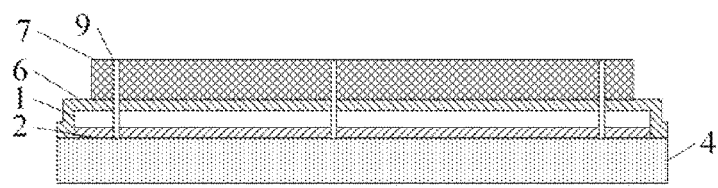
FIG. 7 is a schematic diagram showing the first state in which a flexible display is split according to one embodiment of the invention.
Figure 8:
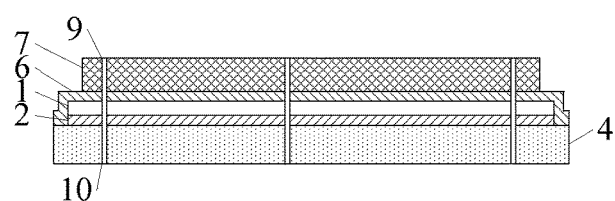
FIG. 8 is a schematic diagram showing the second state in which a flexible display is split according to one embodiment of the invention.
Figure 9:
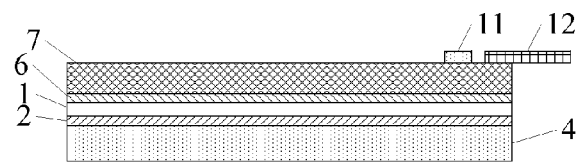
FIG. 9 is a schematic diagram showing the third state in which a flexible display is split according to one embodiment of the invention.
Figure 10:
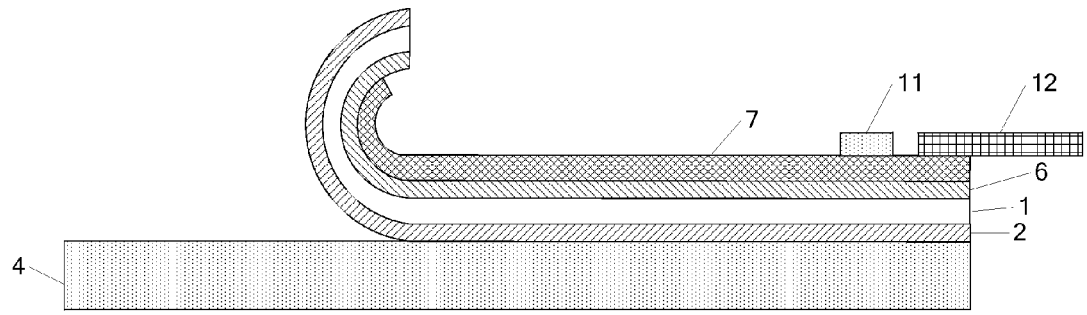
FIG. 10 is a schematic diagram showing the attachment of a circuit to a flexible display according to one embodiment of the invention.

FIG. 7 to FIG. 9 are schematic diagrams showing the splitting a flexible display according to one embodiment of the invention. As shown in FIG. 7 to FIG. 9, after forming a display device body on the planarization layer and/or the water/oxygen barrier layer, the method further includes:

forming a plurality of first fractures 9 that penetrate through the display device body, the planarization layer and/or the water/oxygen barrier layer, the first substrate and the bonding agent layer; and forming a plurality of second fractures 10 that penetrate through the second substrate, and obtaining a plurality of independent flexible display devices, as shown in FIG. 8, wherein the first fractures 9 have a one-to-one correspondence with the second fractures 10, and each first fracture and each second fracture form a fracture plane;

In this embodiment, the display devices are split via the first fractures and the corresponding second fractures, as shown in FIG. 8. The positions of the first fractures 9 are almost coincident with those of the second fractures 10, so that each display screen can be separated from each other independently. Then, auxiliary components, for example, an integrated circuit chip 11 and a flexible circuit board 12, etc., are attached to each independent display screen, as shown in FIG. 9. Finally, the whole flexible display screen prepared is peeled off from the glass substrate, as shown in FIG. 10. In this embodiment, splitting is accomplished by using two fractures, and two fractures, i.e., an upper fracture and a lower fracture, are formed, which has a low requirement of the cutting wheel; however, when one cut is employed, because the cutting depth is large, a specially designed knife wheel will be needed. In the invention, splitting is realized via two fractures, thus cutting may be realized more easily, and fewer fragments will be generated during cutting.

The invention further provides a flexible display, which includes: a display device body; a first substrate; a bonding agent layer; and a planarization layer and/or a water/oxygen barrier layer arranged between the first substrate and the display device body, wherein a first surface of the first substrate is connected with the bonding agent layer, and a second surface of the first substrate that is opposite to the first surface is connected with the planarization layer and/or the water/oxygen barrier layer, and the adhesive force between the bonding agent layer and the second substrate for bearing the bonding agent layer is lower than 5 N/20 mm-wide bonding agent layer.

Preferably, the adhesive force between the bonding agent layer and the second substrate for bearing the bonding agent layer is lower than 0.1 N/20 mm-wide bonding agent layer.

Preferably, an integrated circuit chip and a flexible circuit board are further set on the display device body.

Preferably, the first substrate is a plastic substrate with an expansion coefficient of 1-50 ppm/° C.

Preferably, the first substrate is a plastic substrate with an expansion coefficient of 3-20 ppm/° C.

Preferably, the material of the first substrate is one or more selected from the group consisting of polyimide, polyethylene naphthalate, polyethylene terephthalate, fiber-reinforced plastic, polyethersulfone resin, polyarylester and polycarbonate.

Preferably, the second substrate is a glass substrate, a metal substrate, a quartz substrate or an organic substrate.

It may be known from the above technical solutions that, in the preparation method of the flexible display of the present invention, a bonding agent layer with a low adhesive force is formed on a first substrate, and since the adhesive force of the bonding agent is low, it is very easy to peel off the first substrate, on which the display device body is formed, from the second substrate. In comparison with the existing preparation method of the flexible display device, in the invention, no laser backside processing is required, no costly debonding layer for lowering the adhesive force between the first substrate and the second substrate needs to be prepared, and no undesirable phenomenon such as substrate wrinkling, etc., occurs during the process, so that the production cost is lowered, and the production efficiency is high, thus the preparation method of the present invention is applicable for large-scale production.

The above description only shows some preferred embodiments of the invention. It should be noted that, for one of ordinary skills in the art, various improvements and modifications may also be made without departing from the principle of the invention, and all these improvements and modifications should be construed as pertaining to the protection scope of the invention.

What is claimed is:

1. A method for preparing a flexible display, comprising the steps of:
providing a first substrate;
forming a bonding agent layer on a first surface of the first substrate;
providing a second substrate;
attaching the surface of the first substrate, on which the bonding agent layer is formed, to the second substrate, wherein the second substrate is a glass substrate, a metal substrate or a quartz substrate, and the adhesive force between the bonding agent layer and the second substrate is lower than 5 N/20 mm-wide bonding agent layer;

forming a display device body on a second surface of the first substrate, which is opposite to the first surface of the first substrate; and forming a tilt slot on the edge of the first substrate, then peeling off the first substrate, on which the display device body is formed, from the second substrate using a mechanical force and obtaining the flexible display.

2. The method for preparing a flexible display according to claim 1, wherein the bonding agent layer is formed by adding a filler to silica gel.

3. The method for preparing a flexible display according to claim 1, wherein the bonding agent is formed by adding a filler to acrylic resin.

4. The method for preparing a flexible display according to claim 1, wherein the adhesive force between the bonding agent layer and the second substrate is lower than 0.1 N/20 mm-wide bonding agent layer.

5. The method for preparing a flexible display according to claim 1, wherein the step of forming a display device body on a second surface of the first substrate comprises:

forming a planarization layer, a water/oxygen barrier layer, or both on the second surface of the first substrate; and forming a display device body on the planarization layer, the water/oxygen barrier layer, or both.

6. The method for preparing a flexible display according to claim 5, wherein the step of forming a tilt slot on the edge of the first substrate, then peeling off the first substrate, on which the display device body is formed, from the second substrate using a mechanical force and obtaining the flexible display comprises:

cutting the planarization layer, the water/oxygen barrier layer, or both on the edge of the first substrate to form the tilt slot; and peeling off the first substrate, on which the display device body is formed, from the second substrate along the tilt slot using the mechanical force and obtaining the flexible display.

7. The method for preparing a flexible display according to claim 6, wherein the step of forming a display device body on the first substrate further comprises: forming an integrated circuit chip and a flexible circuit board on the display device body.

8. The method for preparing a flexible display according to claim 7, wherein after forming an integrated circuit chip and a flexible circuit board on the display device body, the first substrate on which the display device body is formed is peeled off from the second substrate using a mechanical force, thereby obtaining the flexible display.

9. The method for preparing a flexible display according to claim 5, wherein after forming a display device body on the planarization layer, the water/oxygen barrier layer, or both, the following steps are further carried out:

forming a plurality of first fractures that penetrate through the display device body, the planarization layer, the water/oxygen barrier layer, or both, the first substrate and the bonding agent layer;

forming a plurality of second fractures that penetrate through the second substrate, and obtaining a plurality of independent flexible display devices, wherein the first fractures have a one-to-one correspondence with the second fractures, and each first fracture and each corresponding second fracture form a fracture plane; and splitting the display devices via the first fractures and the corresponding second fractures.

10. The method for preparing a flexible display according to claim 9, wherein the step of forming a display device body on the first substrate further comprises: forming an integrated circuit chip and a flexible circuit board on the display device body.

11. The method for preparing a flexible display according to claim 1, wherein the first substrate is a plastic substrate with an expansion coefficient of 1-50 ppm/° C.

12. The method for preparing a flexible display according to claim 1, wherein the first substrate is a plastic substrate with an expansion coefficient of 3-20 ppm/° C.

13. The method for preparing a flexible display according to claim 1, wherein the material of the first substrate is one or more selected from the group consisting of polyimide, polyethylene naphthalate, polyethylene terephthalate, fiber-reinforced plastic, polyethersulfone resin, polyarylester and polycarbonate.

* * * * *